(12) United States Patent
Schaefer

(10) Patent No.: US 12,283,333 B2
(45) Date of Patent: Apr. 22, 2025

(54) BIT RETIRING TO MITIGATE BIT ERRORS

(71) Applicant: Micron Technology, Inc., Boise, ID (US)

(72) Inventor: Scott E. Schaefer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/640,651

(22) Filed: Apr. 19, 2024

(65) Prior Publication Data

US 2024/0265991 A1 Aug. 8, 2024

Related U.S. Application Data

(63) Continuation of application No. 17/580,329, filed on Jan. 20, 2022, now Pat. No. 11,990,200.

(60) Provisional application No. 63/142,781, filed on Jan. 28, 2021.

(51) Int. Cl.
| | |
|---|---|
| G11C 29/44 | (2006.01) |
| G11C 29/12 | (2006.01) |
| G11C 29/18 | (2006.01) |
| G11C 29/42 | (2006.01) |

(52) U.S. Cl.
CPC ...... *G11C 29/4401* (2013.01); *G11C 29/1201* (2013.01); *G11C 29/18* (2013.01); *G11C 29/42* (2013.01); *G11C 2029/1806* (2013.01)

(58) Field of Classification Search
None
See application file for complete search history.

(56) References Cited

U.S. PATENT DOCUMENTS

| | | |
|---|---|---|
| 5,974,564 A | 10/1999 | Jeddeloh |
| 8,223,547 B2 | 7/2012 | Conley et al. |
| 8,787,101 B2 | 7/2014 | Keeth et al. |
| 10,359,949 B2 | 7/2019 | Seroff et al. |
| 11,656,935 B2 | 5/2023 | Cha et al. |
| 2010/0106893 A1 | 4/2010 | Fasoli et al. |
| 2013/0329510 A1 | 12/2013 | Keeth et al. |
| 2016/0110249 A1 | 4/2016 | Orme et al. |
| 2018/0225176 A1 | 8/2018 | Kim et al. |

(Continued)

FOREIGN PATENT DOCUMENTS

WO 2015/116133 A2 8/2015

OTHER PUBLICATIONS

"International Search Report and Written Opinion of the International Searching Authority," issued in connection with Int'l Appl. No. PCT/US2022/070320, mailed on May 9, 2022 (12 pages).

*Primary Examiner* — Guerrier Merant
(74) *Attorney, Agent, or Firm* — Holland & Hart LLP

(57) ABSTRACT

Methods, systems, and devices for bit retiring to mitigate bit errors are described. A memory device may retrieve a set of bits from a first row of an address space and may determine that the set of bits includes one or more errors. The memory device may remap at least a portion of the first row from a first row index to a second row index, where the second row index, before the remapping, corresponds to a second row within the address space addressable by the host device. Additionally or alternatively, the memory device may receive a first command to access a first logical address of a memory array that is associated with a first row index. The memory device may determine that the first row includes one or more errors and may transmit a signal indicating that the first row includes the one or more errors.

20 Claims, 9 Drawing Sheets

(56) References Cited

U.S. PATENT DOCUMENTS

| | | |
|---|---|---|
| 2018/0247699 A1 | 8/2018 | Pope et al. |
| 2019/0348146 A1 | 11/2019 | Bradshaw et al. |
| 2023/0153215 A1 | 5/2023 | Wu |

BIT RETIRING TO MITIGATE BIT ERRORS

CROSS REFERENCE

The present application for patent is a continuation of U.S. patent application Ser. No. 17/580,329 by Schaefer, entitled "BIT RETIRING TO MITIGATE BIT ERRORS", filed Jan. 20, 2022, which claims priority to and the benefit of U.S. Provisional Patent Application No. 63/142,781 by Schaefer, entitled "BIT RETIRING TO MITIGATE BIT ERRORS", filed Jan. 28, 2021, each of which are assigned to the assignee hereof, and each of which are expressly incorporated by reference in their entirety herein.

FIELD OF TECHNOLOGY

The following relates generally to one or more systems for memory and more specifically to bit retiring to mitigate bit errors.

BACKGROUND

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

In some memory systems, a row of a memory array may have a bit error when a memory device retrieves a set of bits from the row. The bit error may occur due to a defect (e.g., a memory cell of the row may have a significantly higher or lower retention time than other memory cells of the row, which may be referred to as a variable retention time (VRT)). For instance, the bit error may occur from either internal or external sources (e.g., due to a neutron particle or a VRT) after testing of the memory device occurs. To avoid rows that have defects, the memory device may remap a row index associated with the row that has the bit error to a corresponding redundant row, where a redundant row may be a row not addressable by a host device prior to the memory device performing a remapping to the row. However, in some examples, the quantity of redundant rows may be limited such that there are more rows with bit errors than there are redundant rows.

Systems, devices, and techniques are described for the memory device to remap the row index associated with the row with the bit error to a different row in the memory that is addressable by a host device. By remapping the row index to the row in standard memory, the memory device may increase a likelihood that the host device avoids requesting access to rows with bit errors, but the redundant rows may not be used. For example, the row with the error may be remapped with a row that is less likely to be accessed by the host device during standard operations of the memory device. Additionally, remapping the row index to a different row in standard memory may enable the host device to reduce a likelihood of accessing rows with bit errors.

Additionally or alternatively, the memory device may transmit, to a host device, an indication that a row associated with a logical address requested by the host device for access has one or more bit errors. In some such examples, the host device may request avoid accessing rows with one or more bit errors after receiving the indication. By transmitting an indication, the memory device may enable the host device to avoid rows with bit errors.

Features of the disclosure are initially described in the context of systems as described with reference to FIGS. 1 and 2. Features of the disclosure are described in the context of process flows and bit retiring procedures as described with reference to FIGS. 3-6. These and other features of the disclosure are further illustrated by and described with reference to an apparatus diagram and flowcharts that relate to bit retiring to mitigate bit errors as described with reference to FIGS. 7-9.

Figure 1:
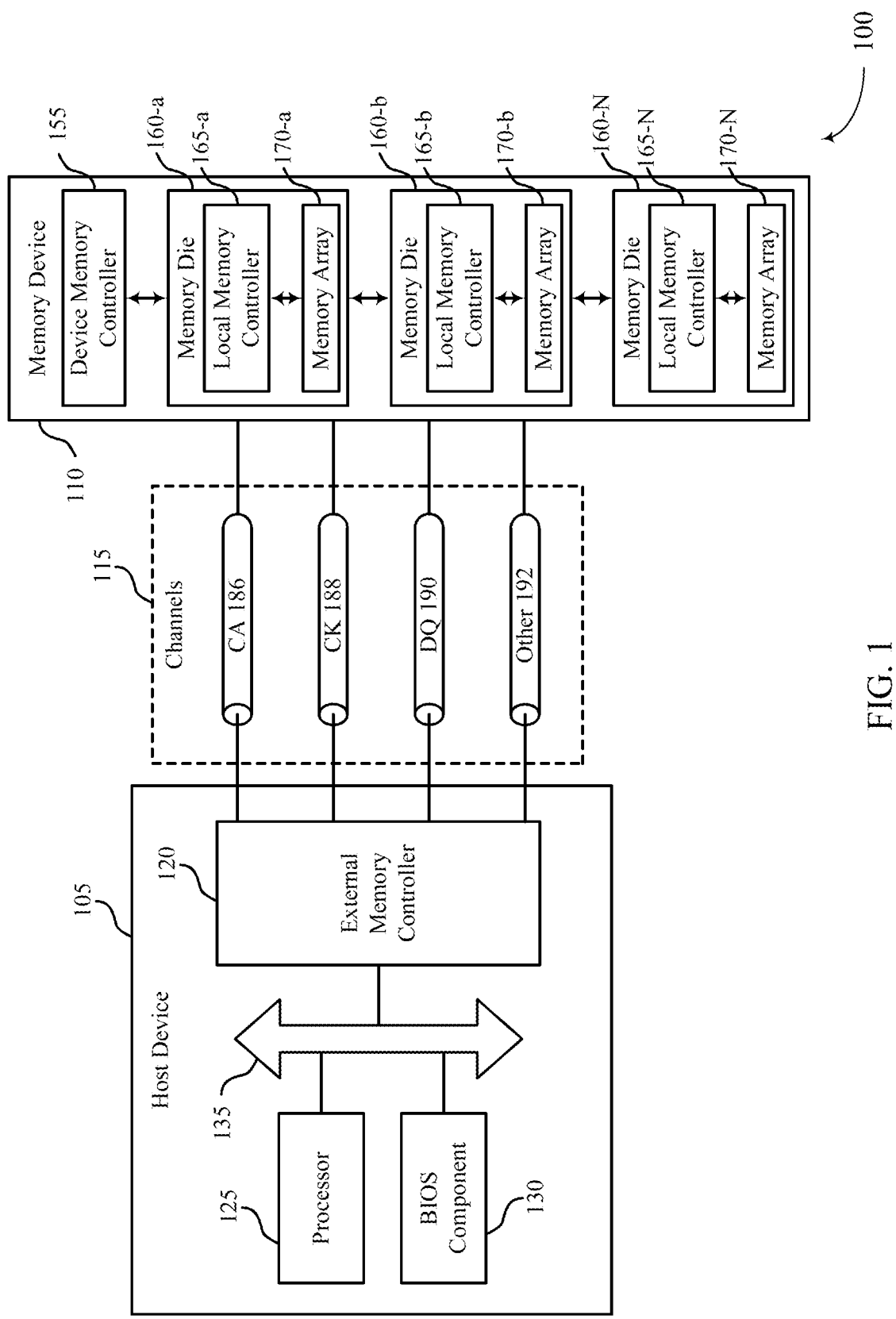
FIG. 1 illustrates an example of a system that supports bit retiring to mitigate bit errors in accordance with examples as disclosed herein.

FIG. 1 illustrates an example of a system 100 that supports bit retiring to mitigate bit errors in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-a, local memory controller 165-b, local memory controller 165-N) and a memory array 170 (e.g., memory array 170-a, memory array 170-b, memory array 170-A). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, CA channels 186 may be operable to communicate commands between the host device 105 and the memory device 110 including control information associated with the commands (e.g., address information). For example, commands carried by the CA channel 186 may include a read command with an address of the desired data. In some examples, a CA channel 186 may include any quantity of signal paths to decode one or more of address or command data (e.g., eight or nine signal paths).

In some examples, data channels 190 may be operable to communicate one or more of data or control information between the host device 105 and the memory device 110. For example, the data channels 190 may communicate information (e.g., bi-directional) to be written to the memory device 110 or information read from the memory device 110.

In some examples, a row of a memory array 170 may produce a bit error when a memory device 110 retrieves a set of bits from the row. In some examples, the bit error may occur due to a defect (e.g., a memory cell of the row may have a significantly higher or lower retention time than other memory cells of the row, which may be referred to as a VRT). For instance, the bit error may occur from either internal or external sources (e.g., due to a neutron particle or a VRT) after testing of the memory device 110 occurs. To avoid rows that have defects, the memory device 110 may remap a row index associated with the row with the bit error to a corresponding redundant row, where a redundant row may be a row that was not addressable by a host device 105 prior to the memory device 110 performing a remapping to the row at least once. However, in some examples, the quantity of redundant rows may be limited such that there are more rows with bit errors than there are redundant rows.

In some examples, the memory device 110 may remap the row index associated with the row with the bit error to a corresponding row in standard memory, where the row in standard memory may be a row that was addressable by a host device 105. By remapping the row index to the row in standard memory, the memory device 110 may increase a likelihood that the host device avoids requesting access to rows with bit errors. Such techniques may also decrease a likelihood that redundant rows may be used, and thereby may reduce an amount of area that may be used for redundant rows in some cases. Additionally, remapping the row index to a row in standard memory may enable the host device 105 to reduce a likelihood of accessing rows with bit errors in examples where the memory device 110 does not include redundant rows.

Additionally or alternatively, the memory device 110 may transmit, to a host device 105 each time the host device 105 requests access to a logical address that maps to a row with bit errors, an indication that the row is with bit errors. In some such examples, the host device 105 may request access to a different logical address after receiving the indication. By transmitting an indication, the memory device 110 may enable the host device 105 to avoid writing data to rows with bit errors. Additionally, transmitting the indication may enable the host device to reduce a likelihood of accessing rows with bit errors in examples.

Figure 2:
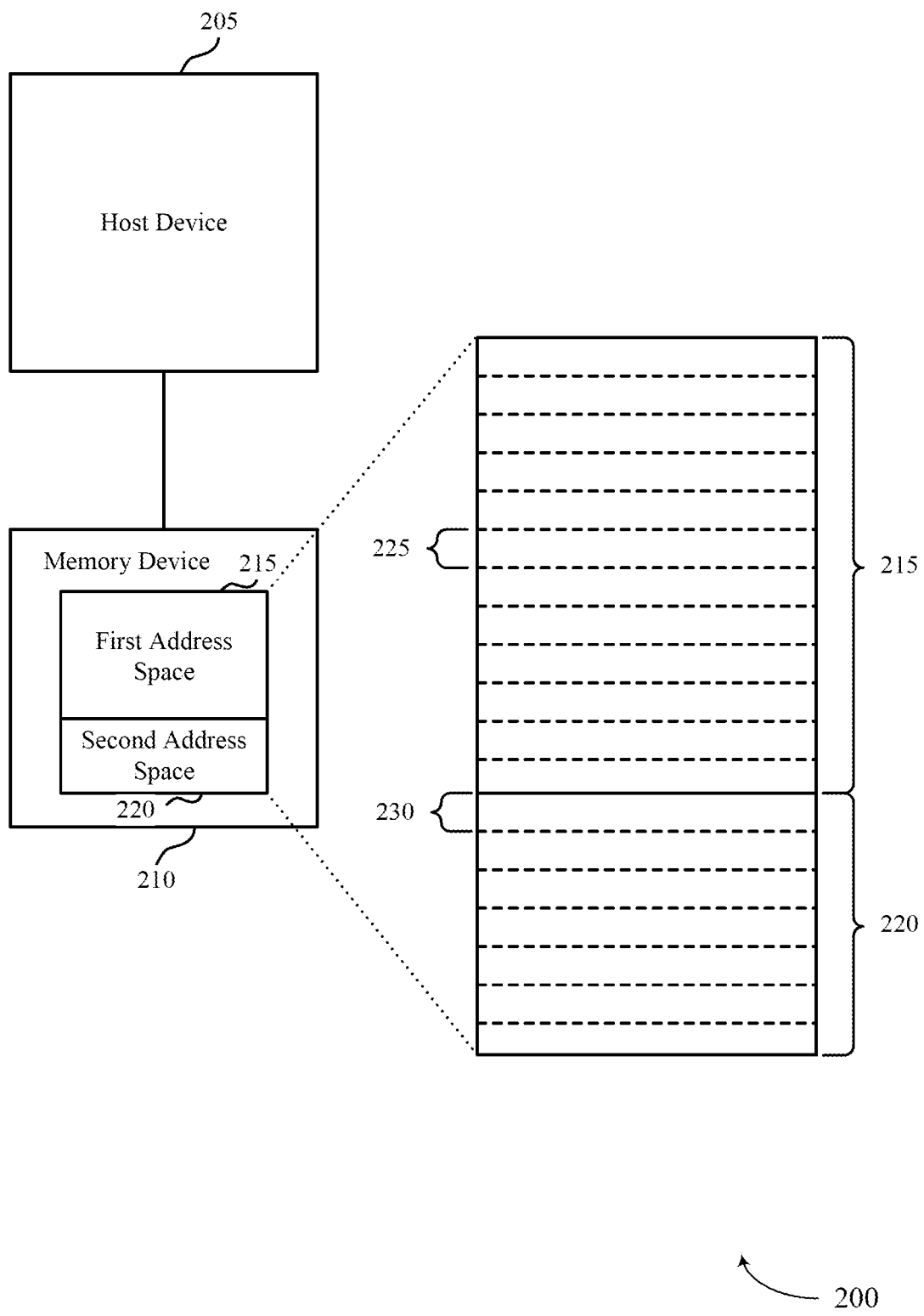
FIG. 2 illustrates an example of a system that supports bit retiring to mitigate bit errors in accordance with examples as disclosed herein.

FIG. 2 illustrates an example of a system 200 that supports bit retiring to mitigate bit errors in accordance with examples as disclosed herein. System 200 may include a host device 205, which may be an example of a host device 105 as described with reference to FIG. 1. System 200 may also include a memory device 210, which may be an example of a memory device 110 as described with reference to FIG. 1.

The system 200 may include a first address space 215 and a second address space 220. Each address space may include a set of addresses (e.g., logical addresses) that each map to a corresponding row index, where each row index is associated with a corresponding row in a memory array of the memory device 210. For instance, the first address space 215 may include row indices 225 and the second address space 220 may include row indices 230. The first address space 215 may be addressable by a host device 205 (e.g., the host device 205 may request access to and may store data at rows of the first address space 215) and rows of the first address space 215 may be referred to as standard rows. The second address space 220 may be examples of redundant address space that may be used to replace defect rows (or other defective components) in the first address space 215. The second address space 220 may initially by inaccessible by the host device 205, but may become addressable by the host device 205 if a row in the second address space 220 is used to replace (e.g., be remapped to) a row in the first address space 215. The rows of the second address space 220 may be referred to as redundant rows.

In some examples, a row that is mapped to a row index 225 of the first address space 215 may produce a bit error. The errors may be identified when the memory device 210 performs a test operation that includes retrieving a set of bits from the row. The bit error may occur, for instance, due to a defect (e.g., a memory cell of the row may have a significantly higher or lower retention time than other memory cells of the row, which may be referred to as a VRT). For instance, the bit error may occur from either internal or external sources (e.g., due to a neutron particle or a VRT) after testing of the memory device 210 occurs. To avoid a row of the first address space 215 with defects, the memory device may remap the row index 225 to a redundant row of the second address space 220. In this manner, the redundant row (which was part of the second address space 220) may become a row of the first address space 215. As such, when a host device 205 requests to access the row index 225 that initially mapped to a row that has a bit error, the memory device 210 may instead access the redundant row. The memory device may not map the row with bit errors to another row index 225 and/or may map the row with bit errors to a row index 230 of the second address space 220.

The quantity of redundant rows of the second address space 220 may be limited. As such, in some examples, the quantity of rows in the first address space 215 with bit errors may exceed the quantity of redundant rows in the second address space 220. Additionally or alternatively, there may be examples where memory device 210 does not have a second address space 220 (e.g., there may be no redundant rows). As such, there may be examples where the host device requests access to a row that has bit errors. If the row has a single bit error due to defects but no other errors are introduced when the set of bits is retrieved, the memory device 210 or the host device 205 may be capable of correcting the bit errors using error control operations, such as error correcting codes. However, having a known error in a row may reduce the effectiveness of such error control operations because some error control operations have a limited quantity of errors that they can correct for in the data. In such cases, a memory device may have less of an ability to correct for transient errors because of permanent errors that are present in the memory array. For example, if the row has a single bit error due to defects but at least one error is introduced when the set of bits is retrieved, the memory device 210 or the host device 205 may fail to correct the bit errors when the error control operation is capable of correcting a single error but not two errors. If the bit errors are not corrected, the data stored at the row with bit errors may be lost.

To prevent data from being lost, a memory device 210 may perform one or more methods to enable a host device 205 to reduce a likelihood of requesting access to rows with bit errors. For instance, the host device 205 may send a write command to store data to a logical address that maps to a row of the first address space 215 with bit errors. In such examples, the memory device 210 may transmit, to the host device 205, an indication that the row has bit errors. As such, the host device 205 may issue a new write command that requests access to a different logical address (e.g., a logical address that maps to a row that does not have bit errors) after receiving the indication. By requesting access to a different logical address, the host device may avoid accessing rows that have bit errors, even in examples where there are more rows with bit errors than redundant rows. Additional details about performing these one or more methods may be described with reference to FIG. 6.

Additionally or alternatively, the memory device 210 may remap at least a portion of a first row (e.g., a portion with bit errors) from a first row index 225 of the first address space 215 to a second row index 225 of the first address space 215. In some cases, rows of the first address space 215 may be more likely to be accessed by the host device 205 and rows of the first address space 215 may be less likely to be accessed by the host device 205. Rows with errors may be swapped (or remapped) with rows that are less likely to be accessed, thereby reducing a likelihood that the host device 205 uses rows with permanent or manufacturing errors. The first address space 215 may include a designated set of row indices 225 (e.g., a set including the highest-value row indices 225 or the lowest-value row indices 225) to be mapped to rows or portions thereof that include bit errors, and the designated set may include the second row index 225. Additionally, the memory device 210 may remap the first row index 225 to a different row in the first address space 215. For instance, the memory device 210 may remap the first row index 225 to a row that the second row index 225 mapped to prior to the remapping. The total quantity of rows of the first address space 215 that may be used for remapping may have a defined value or may be undefined (e.g., unlimited).

By remapping the row index 225 to another row previously addressable in the first address space 215, the memory device 210 may help the host device 205 avoid requesting access to rows with bit errors, even in examples in which there are more rows with bit errors than there are redundant rows. Additionally, remapping the row index 225 to another row previously addressable in the first address space 215, the host device 205 may reduce a likelihood of accessing rows with bit errors in examples where the memory device 210 does not include redundant rows (e.g., does not include the second address space 220). Additional details corresponding to an entire row being mapped to a different row index 225 may be described in further detail herein, for instance, with reference to FIG. 4 and additional details corresponding to a portion of a row being mapped to a different row index 225 may be described in further detail herein, for instance, with reference to FIG. 5. Additionally, further detail about how a memory device 210 performs the remapping may be described herein, for instance, with reference to FIG. 3. In some examples, the memory device 210 may notify and/or inform the host device 205 of memory constraints during boot up (e.g., the host device may store information obtained during boot up).

Figure 3:
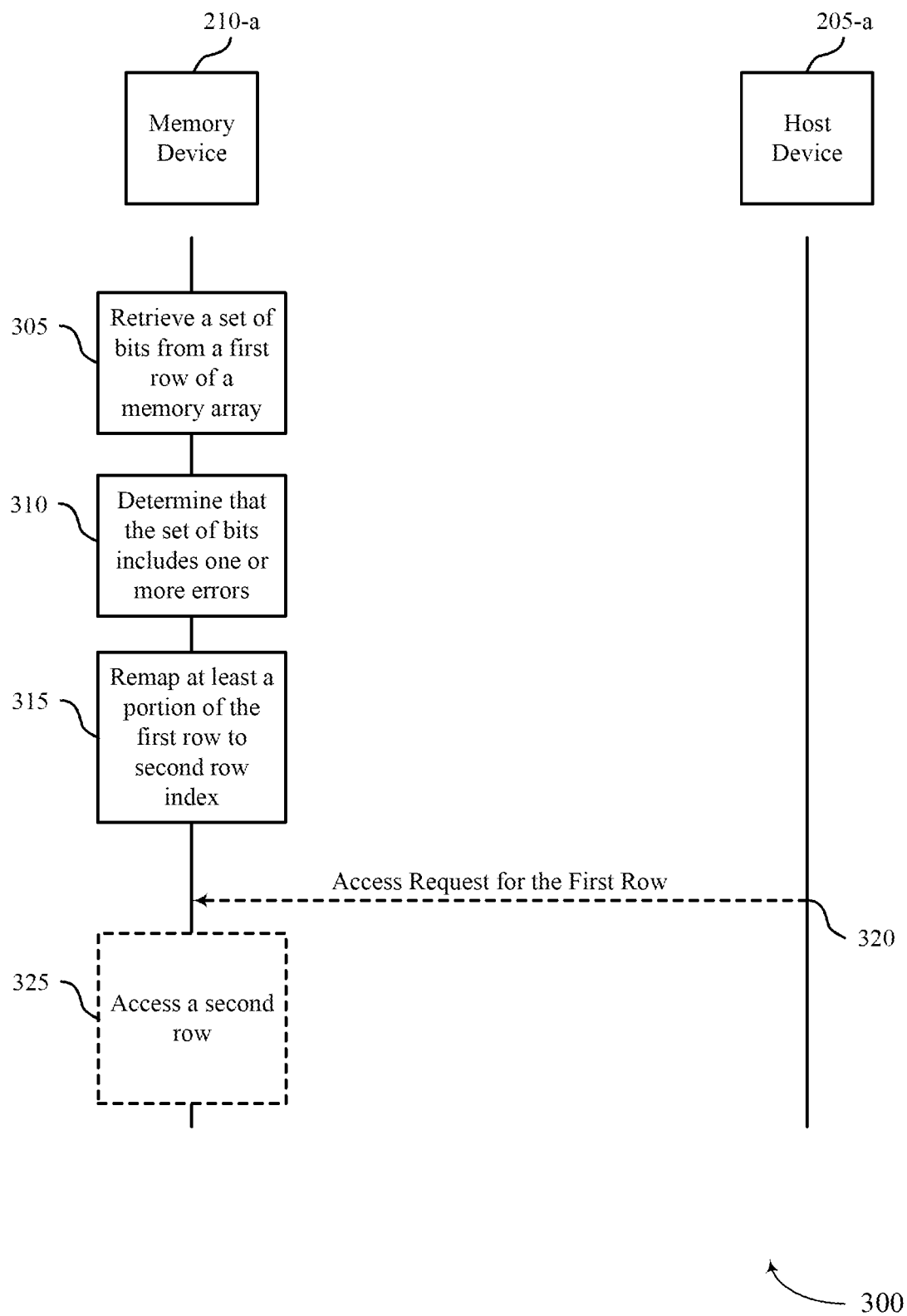
FIG. 3 illustrates an example of a process flow that supports bit retiring to mitigate bit errors in accordance with examples as disclosed herein.

FIG. 3 illustrates an example of a process flow 300 that supports bit retiring to mitigate bit errors in accordance with examples as disclosed herein. Host device 205-a may be an example of a host device 205 as described with reference to FIG. 2 and memory device 210-a may be an example of a memory device 210 as described with reference to FIG. 2.

In some examples, a memory device 210-*a* may initiate a test operation on a memory array of memory device 210-*a*. For instance, memory device 210-*a* may perform one or more of 305, 310, and 315 as part of the test operation. At 305, memory device 210-*a* may retrieve a set of bits from a first row of an address space of a memory array, the address space addressable by host device 205-*a*.

At 310, memory device 210-*a* may determine that the set of bits includes one or more errors. In some examples, the one or more errors may be associated with a retention time of one or more memory cells of the first row. In some examples, the one or more errors may include single bit errors within the set of bits or multi-bit errors within the set of bits. If memory device 210-*a* determines that the set of bits has multi-bit errors, memory device 210-*a* may determine that the set of bits is uncorrectable and that the first row may not be used for storing data. If memory device 210-*a* determines that the set of bits has single-bit errors, memory device 210-*a* may determine that the set of bits is correctable. However, if an additional bit error occurs when retrieving data from or storing data at the first row (e.g., due to a hard error, which may be referred to as a defect, or a soft error, which may be referred to as a neutron or transient error), the data may become uncorrectable. In some examples, single bit errors may occur due to a variable retention time among memory cells of the first row. The retention time among cells may become variable due to stress (e.g., heat) experienced by the memory cells during an associated manufacturing process (e.g., attaching or connecting the memory device 210-*a* to a board).

If the first row has multi-bit errors or single bit errors during testing, memory device 210-*a* may retire the first row. For instance, at 315, memory device 210-*a* may remap at least a portion of the first row from a first row index to a second row index based on determining that the set of bits includes the one or more errors. In some such examples, the second row index, before the remapping, may correspond to a second row within a second address space that is not addressable by host device 205-*a* prior to the remapping (e.g., a redundant row). However, as described herein, the total quantity of rows in the second address space may be limited or the second address space may not be included. As such, in some examples, the second row index, before the remapping, may correspond to a second row within the address space addressable by host device 205-*a*. In some examples memory device 210-*a* may remap at least a portion of the second row from the second row index to the first row index based on determining that the set of bits includes the one or more errors.

In some examples, memory device 210-*a* may retrieve a second set of bits from a third row of the address space of the memory array. memory device 210-*a* may determine that the second set of bits includes one or more second errors and may remap at least a portion of the third row associated with the one or more second errors from a third row index to a fourth row index based on determining that the second set of bits includes the one or more second errors. In some examples, the fourth row index, before the remapping, corresponds to a fourth row within the address space, where the fourth row index is subsequent to the second row index.

In some examples, memory device 210-*a* may remap a third row index from a third row of the address space to a fourth row of a second address space, where the second address space includes one or more redundant rows for replacing one or more rows of the address space, where remapping the first row is based on remapping the third row index. In some examples, the first row may include one or more first subarrays and memory device 210-*a* remapping the portion of the first row may include memory device 210-*a* remapping each of the one or more first subarrays from the first row index to the second row index. In some examples, the first row may include two or more first subarrays and the at least the portion of the first row may be associated with the one or more errors and may include a first of the two or more first subarrays. In some such examples, memory device 210-*a* may remap a first subarray of the two or more first subarrays from the first row index to the second row index and may maintain a mapping of a second subarray of the two or more first subarrays to the first row index.

In some examples, each row of the address space is associated with a corresponding row index of a set of row indices and the second row index may have a highest value or lowest value of the set of row indices. In some examples, retrieving the set of bits and/or determining that the set of bits includes the one or more errors may occur as part of the test operation. In some examples, host device 205-*a* may determine that the set of bits includes the one or more errors. For instance, memory device 210-*a* may transmit the set of bits to host device 205-*a* and host device 205-*a* may transmit an indication to memory device 210-*a* that the set of bits includes the one or more errors.

At 320, host device 205-*a* may transmit, to memory device 210-*a*, a command to access a first logical address associated with the first row index based on remapping the first row from the first row index to the second row index.

At 325, memory device 210-*a* may access the second row, which may be referred to as a repair row, based on receiving the request to access the first logical address and remapping the second row to the first row index.

Figure 4:
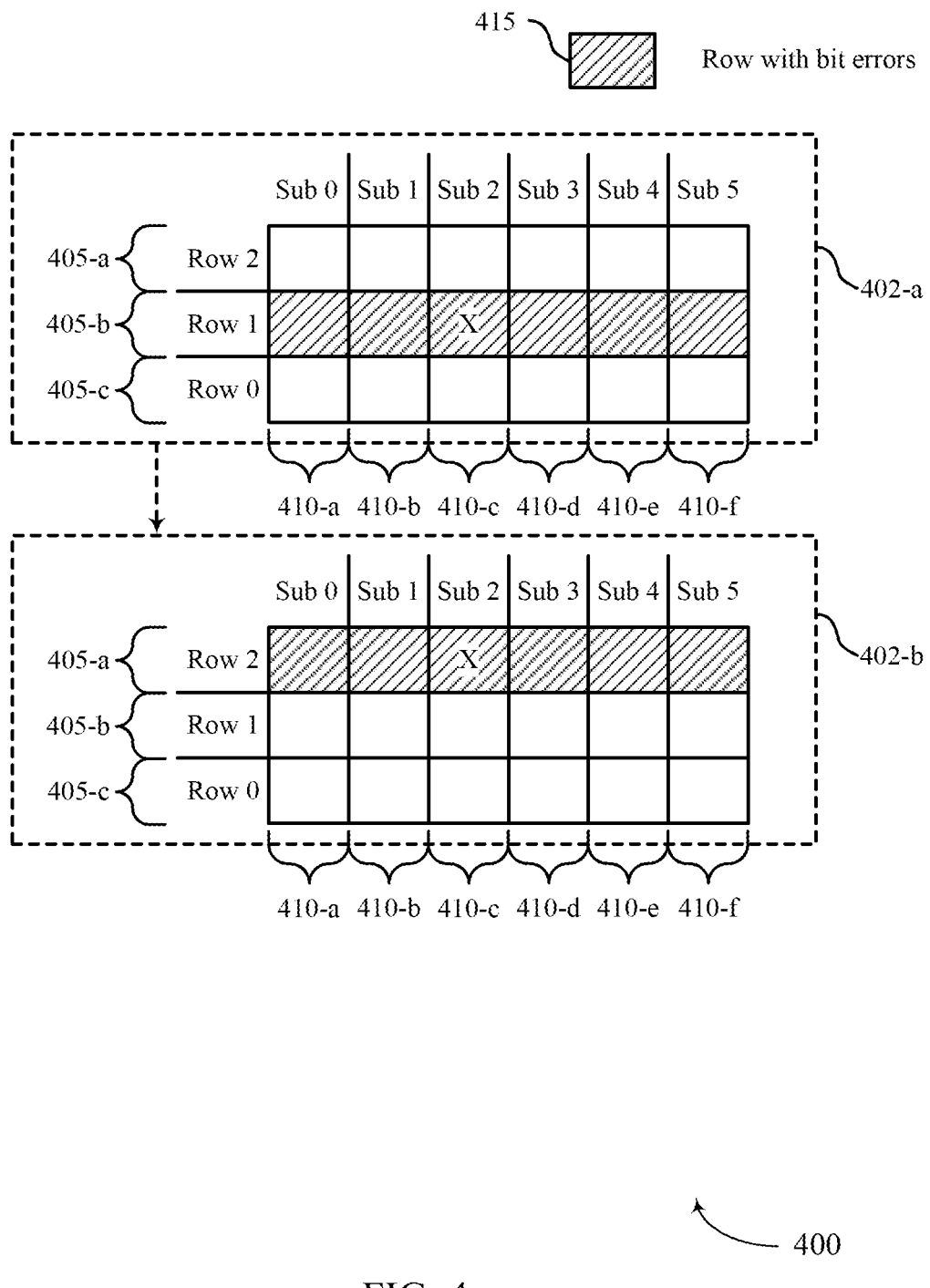
FIG. 4 illustrates an example of a bit retiring procedure that supports bit retiring to mitigate bit errors in accordance with examples as disclosed herein.

FIG. 4 illustrates an example of a bit retiring procedure 400 that supports bit retiring to mitigate bit errors in accordance with examples as disclosed herein. In some examples, bit retiring procedure 400 may represent a procedure performed by a memory device to remap a row index mapped to a row with bit errors to another row.

A memory device may include a memory array with one or more rows of memory cells that map to one or more corresponding row indices 405. For instance, the memory device may include a first row which maps to a first row index 405-*a* (i.e., row index 405-*a*), a second row (e.g., row 415) which maps to a second row index 405-*b* (i.e., Row 1), and a third row which maps to a third row index 405-*c* (i.e., Row 0). The row mapped from each row index 405 may be divided into one or more portions which may be referred to as subarrays, where each subarray may have their own respective subarray index 410. For instance, a subarray of a row may map to subarray index 410-*a* (i.e., Sub 0), subarray index 410-*b* (i.e., Sub 1), subarray index 410-*c* (i.e., Sub 2), subarray index 410-*d* (i.e., Sub 3), subarray index 410-*e* (i.e., Sub 4), and subarray index 410-*f* (i.e., Sub 5).

At stage 402-*a*, a subarray of row 415 (e.g., the subarray with subarray index 510-*c* and row index 505-*b*) may have a bit error (e.g., due to a memory cell of a subarray mapping to subarray index 410-*c* and of the second row having a significantly higher or lower retention time than other memory cells of the second row). At stage 402-*b*, the memory device may remap row index 405-*b* (i.e., Row 1) to the first row (e.g., the row at stage 402-*a* that mapped from row index 405-*a*) and may remap row index 405-*a* (i.e., Row 2) to row 415. Generally, for each row that has a subarray with a bit error, the memory device may remap the row index 405 for that row to a set of highest or a set of lowest row indices (e.g., the row indices with the highest or lowest values).

Figure 5:
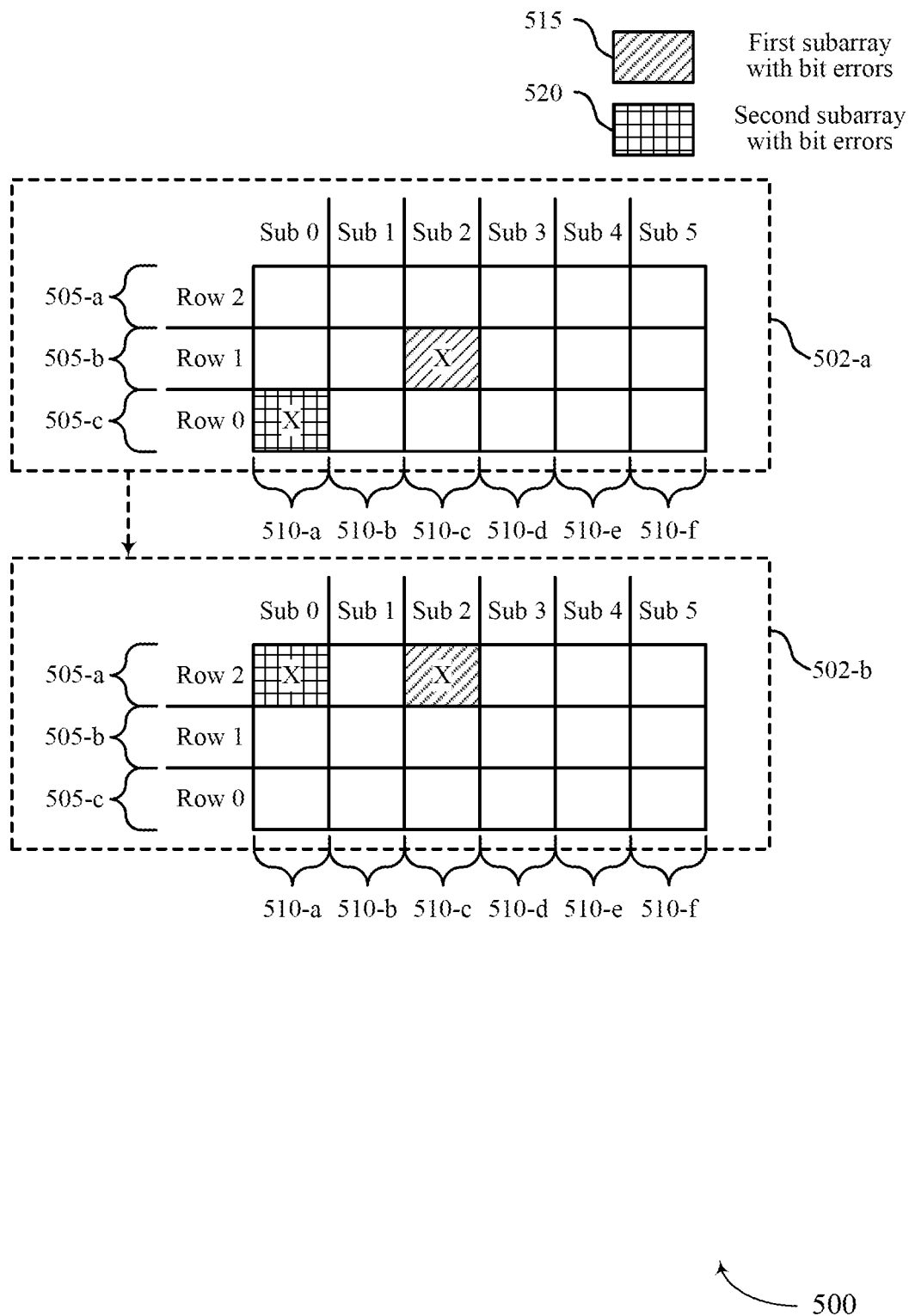
FIG. 5 illustrates an example of a bit retiring procedure that supports bit retiring to mitigate bit errors in accordance with examples as disclosed herein.

FIG. 5 illustrates an example of a bit retiring procedure 500 that supports bit retiring to mitigate bit errors in accordance with examples as disclosed herein. In some examples, bit retiring procedure 500 may represent a procedure performed by a memory device to remap a row index for a portion of a row (e.g., subarray) to a corresponding portion of another row.

A memory device may include a memory array with one or more rows of memory cells that map to one or more corresponding row indices 505. For instance, the memory device may include a first row which maps to a first row index 505-a (i.e., Row 2), a second row which maps to a second row index 505-b (i.e., Row 1), and a third row which maps to a third row index 505-c (i.e., Row 0). The row mapped from each row index 405 may be divided into one or more portions which may be referred to as subarrays, where each subarray may have their own respective subarray index 410. For instance, a subarray of a row may map to subarray index 510-a (i.e., Sub 0), subarray index 510-b (i.e., Sub 1), subarray index 510-c (i.e., Sub 2), subarray index 510-d (i.e., Sub 3), subarray index 510-e (i.e., Sub 4), and subarray index 510-f (i.e., Sub 5).

At stage 502-a, subarray 515 of the second row (e.g., the row which maps from row index 505-b at stage 502-a) and subarray 520 of the third row (e.g., the row which maps from row index 505-c at stage 502-a) may have bit errors (e.g., due to a memory cell of subarray 515 and a memory cell of subarray 520 having a significantly higher or lower retention time than other memory cells of the second row and the third row, respectively). At stage 502-a, subarray 515 may map to row index 505-b and subarray index 510-c, and subarray 520 may map to row index 505-c and subarray index 510-a. At stage 502-b, the memory device may remap the subarray 520 of the third row and subarray 515 of the second row to row index 505-a. In some such examples, subarray 515 and 520 may have the same subarray index as at stage 502-a (e.g., subarray 515 may still map to subarray index 510-a and subarray 520 may still map to subarray index 510-c). Additionally, the memory device may remap a first subarray of the first row (e.g., the subarray at subarray index 510-a and of the row which maps from row index 505-a at stage 502-a) to row index 505-c and may remap a second subarray of the first row to row index 505-b (e.g., the subarray at subarray index 510-c and of the row which maps from row index 505-a at stage 502-a). Generally, for each row that has a subarray with a bit error, the memory device may remap the subarray to one of a set of highest row indices or a set of lowest row indices (e.g., the row indices with the highest or lowest values).

Figure 6:
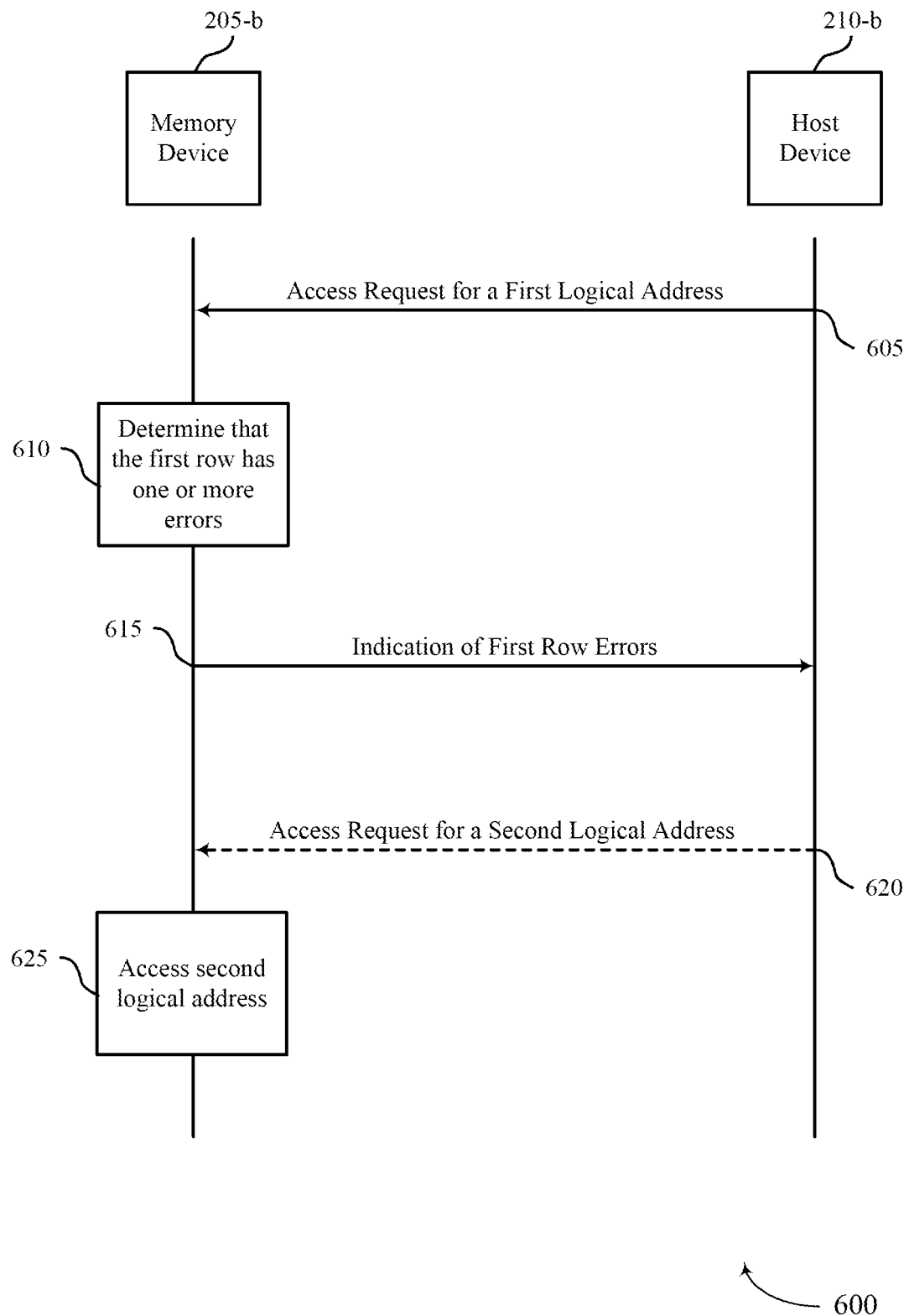
FIG. 6 illustrates an example of a process flow that supports bit retiring to mitigate bit errors in accordance with examples as disclosed herein.

FIG. 6 illustrates an example of a process flow 600 that supports bit retiring to mitigate bit errors in accordance with examples as disclosed herein. Host device 205-b may be an example of a host device 205 as described with reference to FIG. 2 and memory device 210-b may be an example of a memory device 210 as described with reference to FIG. 2.

In some examples, a memory device 210-b may initiate a test operation on a memory array of memory device 210-b. As part of the test operation, memory device 210-b may identify rows of the memory array that have errors. For instance, memory device 210-b may retrieve a set of bits from some or each rows of the memory array and may determine whether each of the set of bits includes one or more errors (e.g., multi-bit errors or single bit errors). If a row has errors during testing, memory device 210-b may retire the row. For instance, memory device 210-b may remap at least a portion of the row from a first row index to a second row index based on determining that the set of bits includes the one or more errors, where second row index may correspond to a second row within a second address space that is not addressable by host device 205-b prior to the remapping. However, as described herein, the total quantity of rows in the second address space may be limited or the second address space may not be included. As such, in some examples, memory device 210-b may identify a set of row indices that each include the one or more respective errors as part of the test operation. For instance, memory device 210-b may add a row index corresponding to the row to a list of row indices that map to rows with errors.

At 605, host device 205-b may transmit, to memory device 210-b, a first command to access a first logical address of a memory array that is associated with a first row index.

At 610, memory device 210-b may determine that a first row associated with the first row index includes one or more errors based on receiving the first command. In some examples, memory device 210-b may identify the first row index from a set of row indices (e.g., the list generated during the test operation), where each row index of the set of row indices is associated with a corresponding row that includes one or more errors. In some such examples, determining that the first row includes the one or more errors may be based on identifying the first row index from the set of row indices. In some examples, identifying the first row index is based on initiating the test operation and identifying the set of row indices. In some examples, memory device 210-b may refrain from accessing the first logical address of the memory array based on determining that the first row includes the one or more errors. In some examples, the one or more errors may be associated with a retention time (e.g., a variable retention time) of one or more memory cells of the first row.

At 615, memory device 210-b may transmit, to host device 205-b, a signal indicating that the first row includes the one or more errors based on determining that the first row includes the one or more errors. In some examples, the signal may further indicate for the host device to request access to a second row index associated with a second row of the memory array. In some examples, the first logical address may be refrained from being accessed (e.g., by memory device 210-b) between a first time associated with receiving the command (e.g., at 610) and a second time associated with transmitting the signal (e.g., at 615).

At 620, host device 205-b may transmit, to memory device 210-b, a second command to access a second logical address of the memory array that is associated with the second row index based on transmitting the signal (e.g., at 615).

At 625, memory device 210-b may access the second logical address of the memory array.

Figure 7:
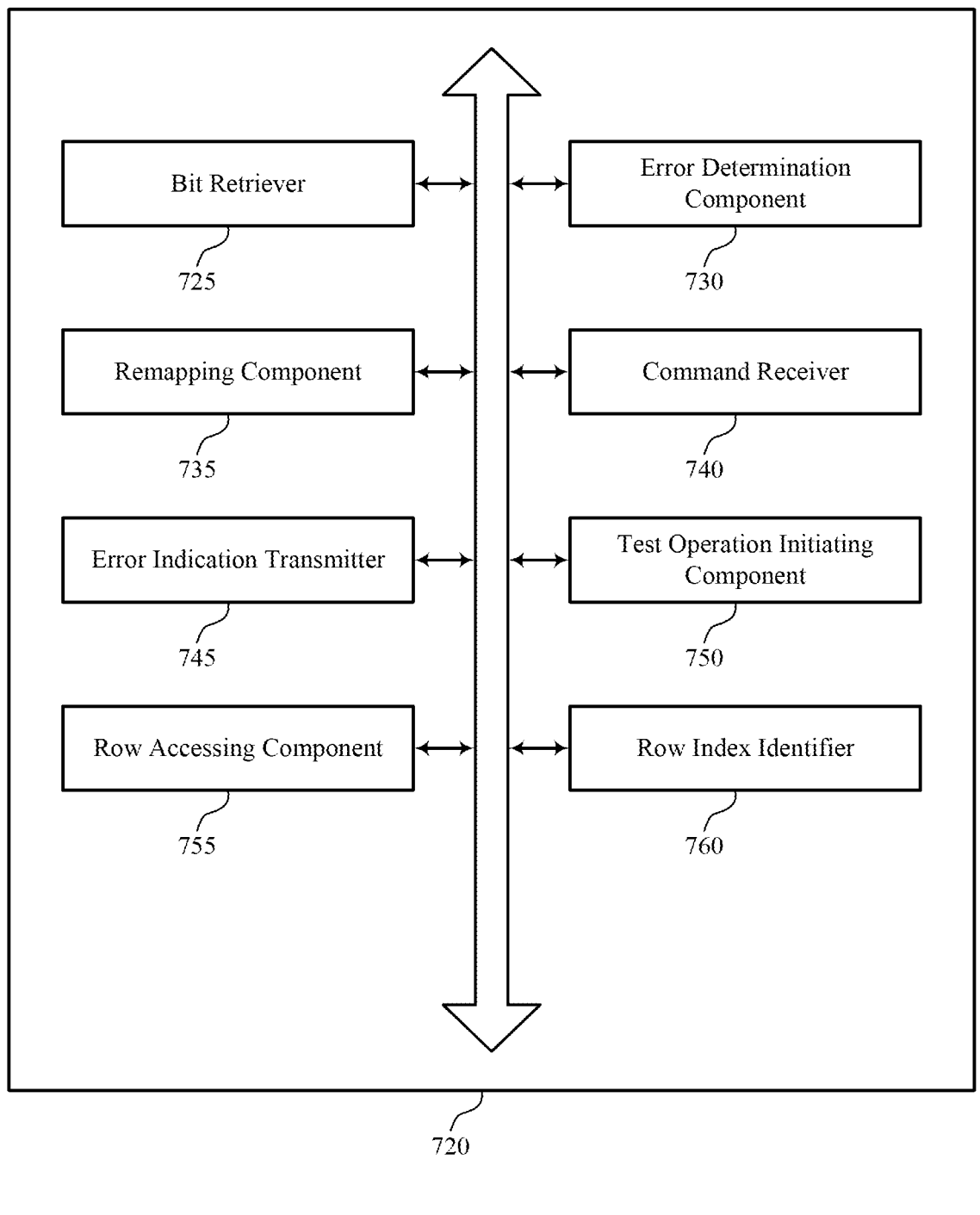
FIG. 7 shows a block diagram of a memory device that supports bit retiring to mitigate bit errors in accordance with examples as disclosed herein.

FIG. 7 shows a block diagram 700 of a memory device 720 that supports bit retiring to mitigate bit errors in accordance with examples as disclosed herein. The memory device 720 may be an example of aspects of a memory device as described with reference to FIGS. 1 through 6. The memory device 720, or various components thereof, may be an example of means for performing various aspects of bit retiring to mitigate single bit errors as described herein. For example, the memory device 720 may include a bit retriever 725, an error determination component 730, a remapping component 735, a command receiver 740, an error indication transmitter 745, a test operation initiating component 750, a row accessing component 755, a row index identifier 760, or any combination thereof. Each of these components may communicate, directly or indirectly, with one another (e.g., via one or more buses).

The bit retriever 725 may be configured as or otherwise support a means for retrieving a set of bits from a first row of an address space of a memory array, the address space addressable by a host device. The error determination component 730 may be configured as or otherwise support a means for determining that the set of bits includes one or more errors. The remapping component 735 may be configured as or otherwise support a means for remapping at least a portion of the first row from a first row index to a second row index based at least in part on determining that the set of bits includes the one or more errors, where the second row index, before the remapping, corresponds to a second row within the address space addressable by the host device.

In some examples, the remapping component 735 may be configured as or otherwise support a means for remapping at least a portion of the second row from the second row index to the first row index based at least in part on determining that the set of bits includes the one or more errors.

In some examples, the command receiver 740 may be configured as or otherwise support a means for receiving, from the host device, a command to access a first logical address associated with the first row index based at least in part on remapping the first row from the first row index to the second row index. In some examples, the row accessing component 755 may be configured as or otherwise support a means for accessing the second row based at least in part on receiving the request to access the first logical address and remapping the second row to the first row index.

In some examples, the bit retriever 725 may be configured as or otherwise support a means for retrieving a second set of bits from a third row of the address space of the memory array. In some examples, the error determination component 730 may be configured as or otherwise support a means for determining that the second set of bits includes one or more second errors. In some examples, the remapping component 735 may be configured as or otherwise support a means for remapping at least a portion of the third row associated with the one or more second errors from a third row index to a fourth row index based at least in part on determining that the second set of bits includes the one or more second errors, where the fourth row index, before the remapping, corresponds to a fourth row within the address space, and where the fourth row index is subsequent to the second row index.

In some examples, the remapping component 735 may be configured as or otherwise support a means for remapping a third row index from a third row of the address space to a fourth row of a second address space, where the second address space includes one or more redundant rows for replacing one or more rows of the address space, where remapping the first row is based at least in part on remapping the third row index.

In some examples, the first row includes one or more first subarrays. In some examples, the remapping component 735 remapping the portion of the first row further includes the remapping component 735 remapping each of the one or more first subarrays from the first row index to the second row index.

In some examples, the first row includes two or more first subarrays. In some examples, the at least the portion of the first row is associated with the one or more errors and includes a first of the two or more first subarrays. In some examples, the remapping component 735 may remap a first subarray of the two or more first subarrays from the first row index to the second row index. In some examples, the remapping component 735 may maintain a mapping of a second subarray of the two or more first subarrays to the first row index.

In some examples, the one or more errors are associated with a retention time of one or more memory cells of the first row.

In some examples, each row of the address space is associated with a corresponding row index of a set of row indices. In some examples, the second row index has a highest value or lowest value of the set of row indices.

In some examples, the test operation initiating component 750 may be configured as or otherwise support a means for initiating a test operation on the memory array, where retrieving the set of bits and determining that the set of bits includes the one or more errors occurs as part of the test operation.

In some examples, the one or more errors includes single bit errors within the set of bits or multi-bit errors with the set of bits.

In some examples, a memory device including the memory array or the host device determines that the set of bits includes one or more errors.

The command receiver 740 may be configured as or otherwise support a means for receiving, from a host device, a first command to access a first logical address of a memory array that is associated with a first row index. In some examples, the error determination component 730 may be configured as or otherwise support a means for determining that a first row associated with the first row index includes one or more errors based at least in part on receiving the first command. The error indication transmitter 745 may be configured as or otherwise support a means for transmitting, to the host device, a signal indicating that the first row includes the one or more errors based at least in part on determining that the first row includes the one or more errors.

In some examples, the signal further indicates for the host device to request access to a second row index associated with a second row of the memory array.

In some examples, the command receiver 740 may be configured as or otherwise support a means for receiving, from the host device, a second command to access a second logical address of the memory array that is associated with the second row index based at least in part on transmitting the signal.

In some examples, the row accessing component 755 may be configured as or otherwise support a means for refraining from accessing the first logical address of the memory array based at least in part on determining that the first row includes the one or more errors.

In some examples, the first logical address is refrained from being accessed between a first time associated with receiving the command and a second time associated with transmitting the signal.

In some examples, the row index identifier 760 may be configured as or otherwise support a means for identifying the first row index from a set of row indices, where each row index of the set of row indices is associated with a corresponding row that includes one or more respective errors, where determining that the first row includes the one or more errors is based at least in part on identifying the first row index from the set of row indices.

In some examples, the test operation initiating component 750 may be configured as or otherwise support a means for initiating a test operation on the memory array. In some examples, the row index identifier 760 may be configured as or otherwise support a means for identifying the set of row indices that each include the one or more respective errors as part of the test operation, where identifying the first row index is based at least in part on initiating the test operation and identifying the set of row indices.

In some examples, the one or more errors are associated with a retention time of one or more memory cells of the first row.

Figure 8:
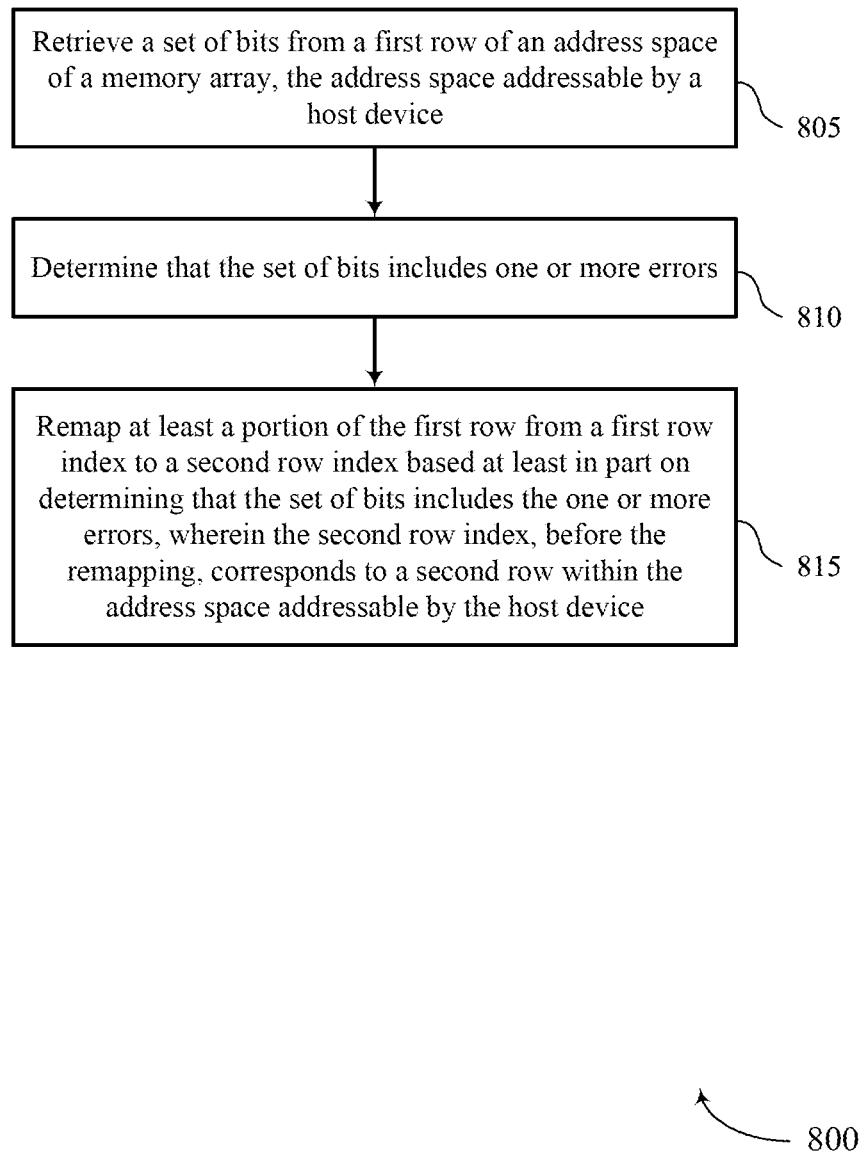
FIG. 8 shows a flowchart illustrating a method or methods that support bit retiring to mitigate bit errors in accordance with examples as disclosed herein.

FIG. 8 shows a flowchart illustrating a method 800 that supports bit retiring to mitigate bit errors in accordance with examples as disclosed herein. The operations of method 800 may be implemented by a memory device or its components as described herein. For example, the operations of method 800 may be performed by a memory device as described with reference to FIGS. 1 through 7. In some examples, a memory device may execute a set of instructions to control the functional elements of the device to perform the described functions. Additionally or alternatively, the memory device may perform aspects of the described functions using special-purpose hardware.

At 805, the method may include retrieving a set of bits from a first row of an address space of a memory array, the address space addressable by a host device. The operations of 805 may be performed in accordance with examples as disclosed herein. In some examples, aspects of the operations of 805 may be performed by a bit retriever 725 as described with reference to FIG. 7.

At 810, the method may include determining that the set of bits includes one or more errors. The operations of 810 may be performed in accordance with examples as disclosed herein. In some examples, aspects of the operations of 810 may be performed by an error determination component 730 as described with reference to FIG. 7.

At 815, the method may include remapping at least a portion of the first row from a first row index to a second row index based at least in part on determining that the set of bits includes the one or more errors, where the second row index, before the remapping, corresponds to a second row within the address space addressable by the host device. The operations of 815 may be performed in accordance with examples as disclosed herein. In some examples, aspects of the operations of 815 may be performed by a remapping component 735 as described with reference to FIG. 7.

In some examples, an apparatus as described herein may perform a method or methods, such as the method 800. The apparatus may include, features, circuitry, logic, means, or instructions (e.g., a non-transitory computer-readable medium storing instructions executable by a processor) for retrieving a set of bits from a first row of an address space of a memory array, the address space addressable by a host device, determining that the set of bits includes one or more errors, and remapping at least a portion of the first row from a first row index to a second row index based at least in part on determining that the set of bits includes the one or more errors, where the second row index, before the remapping, corresponds to a second row within the address space addressable by the host device.

Some examples of the method 800 and the apparatus described herein may further include operations, features, circuitry, logic, means, or instructions for remapping at least a portion of the second row from the second row index to the first row index based at least in part on determining that the set of bits includes the one or more errors.

Some examples of the method 800 and the apparatus described herein may further include operations, features, circuitry, logic, means, or instructions for receiving, from the host device, a command to access a first logical address associated with the first row index based at least in part on remapping the first row from the first row index to the second row index and accessing the second row based at least in part on receiving the request to access the first logical address and remapping the second row to the first row index.

Some examples of the method 800 and the apparatus described herein may further include operations, features, circuitry, logic, means, or instructions for retrieving a second set of bits from a third row of the address space of the memory array, determining that the second set of bits includes one or more second errors, and remapping at least a portion of the third row associated with the one or more second errors from a third row index to a fourth row index based at least in part on determining that the second set of bits includes the one or more second errors, where the fourth row index, before the remapping, corresponds to a fourth row within the address space, and where the fourth row index may be subsequent to the second row index.

Some examples of the method 800 and the apparatus described herein may further include operations, features, circuitry, logic, means, or instructions for remapping a third row index from a third row of the address space to a fourth row of a second address space, where the second address space includes one or more redundant rows for replacing one or more rows of the address space, where remapping the first row may be based at least in part on remapping the third row index.

In some examples of the method 800 and the apparatus described herein, the first row includes one or more first subarrays and remapping the portion of the first row further includes remapping each of the one or more first subarrays from the first row index to the second row index.

In some examples of the method 800 and the apparatus described herein, the first row includes two or more first subarrays, the at least the portion of the first row may be associated with the one or more errors and includes a first of the two or more first subarrays, and the method 800 and apparatus described herein may further include operations, features, circuitry, logic, means, or instructions for remapping a first subarray of the two or more first subarrays from the first row index to the second row index, and maintaining a mapping of a second subarray of the two or more first subarrays to the first row index.

In some examples of the method 800 and the apparatus described herein, the one or more errors may be associated with a retention time of one or more memory cells of the first row.

In some examples of the method 800 and the apparatus described herein, each row of the address space may be associated with a corresponding row index of a set of row indices and the second row index may have a highest value or lowest value of the set of row indices.

Some examples of the method 800 and the apparatus described herein may further include operations, features, circuitry, logic, means, or instructions for initiating a test operation on the memory array, where retrieving the set of bits and determining that the set of bits includes the one or more errors occurs as part of the test operation.

In some examples of the method 800 and the apparatus described herein, the one or more errors includes single bit errors within the set of bits or multi-bit errors with the set of bits.

In some examples of the method 800 and the apparatus described herein, a memory device including the memory array or the host device determines that the set of bits includes one or more errors.

Figure 9:
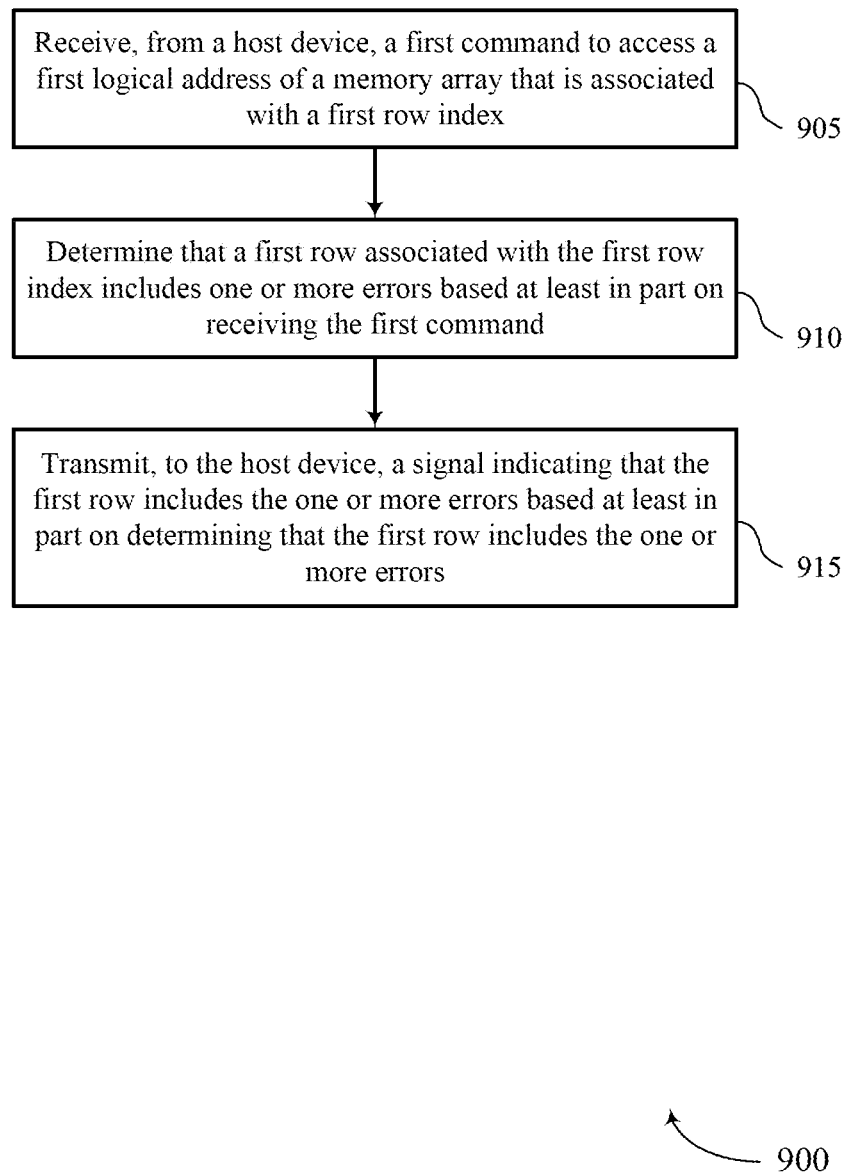
FIG. 9 shows a flowchart illustrating a method or methods that support bit retiring to mitigate bit errors in accordance with examples as disclosed herein.

FIG. 9 shows a flowchart illustrating a method 900 that supports bit retiring to mitigate bit errors in accordance with examples as disclosed herein. The operations of method 900 may be implemented by a memory device or its components as described herein. For example, the operations of method 900 may be performed by a memory device as described with reference to FIGS. 1 through 7. In some examples, a memory device may execute a set of instructions to control the functional elements of the device to perform the described functions. Additionally or alternatively, the memory device may perform aspects of the described functions using special-purpose hardware.

At 905, the method may include receiving, from a host device, a first command to access a first logical address of a memory array that is associated with a first row index. The operations of 905 may be performed in accordance with examples as disclosed herein. In some examples, aspects of the operations of 905 may be performed by a command receiver 740 as described with reference to FIG. 7.

At 910, the method may include determining that a first row associated with the first row index includes one or more errors based at least in part on receiving the first command. The operations of 910 may be performed in accordance with examples as disclosed herein. In some examples, aspects of the operations of 910 may be performed by an error determination component 730 as described with reference to FIG. 7.

At 915, the method may include transmitting, to the host device, a signal indicating that the first row includes the one or more errors based at least in part on determining that the first row includes the one or more errors. The operations of 915 may be performed in accordance with examples as disclosed herein. In some examples, aspects of the operations of 915 may be performed by an error indication transmitter 745 as described with reference to FIG. 7.

In some examples, an apparatus as described herein may perform a method or methods, such as the method 900. The apparatus may include, features, circuitry, logic, means, or instructions (e.g., a non-transitory computer-readable medium storing instructions executable by a processor) for receiving, from a host device, a first command to access a first logical address of a memory array that is associated with a first row index, determining that a first row associated with the first row index includes one or more errors based at least in part on receiving the first command, and transmitting, to the host device, a signal indicating that the first row includes the one or more errors based at least in part on determining that the first row includes the one or more errors.

In some examples of the method 900 and the apparatus described herein, the signal further indicates for the host device to request access to a second row index associated with a second row of the memory array.

Some examples of the method 900 and the apparatus described herein may further include operations, features, circuitry, logic, means, or instructions for receiving, from the host device, a second command to access a second logical address of the memory array that may be associated with the second row index based at least in part on transmitting the signal.

Some examples of the method 900 and the apparatus described herein may further include operations, features, circuitry, logic, means, or instructions for refraining from accessing the first logical address of the memory array based at least in part on determining that the first row includes the one or more errors.

In some examples of the method 900 and the apparatus described herein, the first logical address may be refrained from being accessed between a first time associated with receiving the command and a second time associated with transmitting the signal.

Some examples of the method 900 and the apparatus described herein may further include operations, features, circuitry, logic, means, or instructions for identifying the first row index from a set of row indices, where each row index of the set of row indices may be associated with a corresponding row that includes one or more respective errors, where determining that the first row includes the one or more errors may be based at least in part on identifying the first row index from the set of row indices.

Some examples of the method 900 and the apparatus described herein may further include operations, features, circuitry, logic, means, or instructions for initiating a test operation on the memory array and identifying the set of row indices that each include the one or more respective errors as part of the test operation, where identifying the first row index may be based at least in part on initiating the test operation and identifying the set of row indices.

In some examples of the method 900 and the apparatus described herein, the one or more errors may be associated with a retention time of one or more memory cells of the first row.

It should be noted that the methods described herein describe possible implementations, and that the operations and the steps may be rearranged or otherwise modified and that other implementations are possible. Further, portions from two or more of the methods may be combined.

Another apparatus is described. The apparatus may include a memory array, where the memory array includes an array of memory cells that each include capacitive storage elements, and a circuit coupled with the memory array and configured to cause the apparatus to: retrieve a set of bits from a first row of an address space of the memory array, where the address space is addressable by a host device, determine that the set of bits includes one or more errors, and remap at least a portion of the first row from a first row index to a second row index based at least in part on determining that the set of bits includes the one or more errors, where the second row index, before the remapping, corresponds to a second row within the address space addressable by the host device In some examples of the apparatus, the circuit may be further configured to cause the apparatus to remap at least a portion of the second row from the second row index to the first row index based at least in part on determining that the set of bits includes the one or more errors.

In some examples, the circuit may be further configured to cause the apparatus to receive, from the host device, a command to access a first logical address associated with the first row index based at least in part on remapping the first row from the first row index to the second row index and to access the second row based at least in part on receiving the request to access the first logical address and remapping the second row to the first row index.

In some examples, the circuit may be further configured to cause the apparatus to retrieve a second set of bits from a third row of the address space of the memory array, determine that the second set of bits includes one or more second errors, and to remap at least a portion of the third row associated with the one or more second errors from a third row index to a fourth row index based at least in part on determining that the second set of bits includes the one or more second errors, where the fourth row index, before the remapping, corresponds to a fourth row within the address space, and where the fourth row index may be subsequent to the second row index.

In some examples of the apparatus, the circuit may be further configured to cause the apparatus to remap a third row index from a third row of the address space to a fourth row of a second address space, where the second address space includes one or more redundant rows for replacing one or more rows of the address space, where remapping the first row may be based at least in part on remapping the third row index.

In some examples of the apparatus, the first row includes one or more first subarrays and remapping the portion of the first row further may include the circuit being configured to cause the apparatus to remap each of the one or more first subarrays from the first row index to the second row index.

In some examples of the apparatus, the first row includes two or more first subarrays, the at least the portion of the first row may be associated with the one or more errors and includes a first of the two or more first subarrays, and the circuit may be further configured to cause the apparatus to: remap a first subarray of the two or more first subarrays from the first row index to the second row index, and maintain a mapping of a second subarray of the two or more first subarrays to the first row index.

In some examples of the apparatus, the one or more errors may be associated with a retention time of one or more memory cells of the first row.

Another apparatus is described. The apparatus may include a memory array, where the memory array includes an array of memory cells that each include capacitive storage elements, a circuit coupled with the memory array and configured to cause the apparatus to: receive, from a host device, a first command to access a first logical address of the memory array that is associated with a first row index, determine that a first row associated with the first row index includes one or more errors based at least in part on receiving the first command, and transmit, to the host device, a signal indicating that the first row includes the one or more errors based at least in part on determining that the first row includes the one or more errors In some examples of the apparatus, the signal further indicates for the host device to request access to a second row index associated with a second row of the memory array.

In some examples, the circuit may be further configured to cause the apparatus to receive, from the host device, a second command to access a second logical address of the memory array that may be associated with the second row index based at least in part on transmitting the signal.

In some examples, the circuit may be further configured to cause the apparatus to include refrain from accessing the first logical address of the memory array based at least in part on determining that the first row includes the one or more errors.

In some examples, the circuit may be further configured to cause the apparatus to: include identify the first row index from a set of row indices, where each row index of the set of row indices may be associated with a corresponding row that includes one or more respective errors, where determining that the first row includes the one or more errors may be based at least in part on identifying the first row index from the set of row indices.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
    determining that a first set of bits retrieved from a first row of a memory array includes one or more errors;
    remapping a portion of the first row from a first row index to a second row index based at least in part on determining that the first set of bits includes the one or more errors, wherein the second row index, before remapping the first row, corresponds to a second row of the memory array;

determining that a second set of bits retrieved from a third row of the memory array includes one or more errors, wherein the third row corresponds to a third row index; and selecting, for remapping a portion of the third row from the third row index based at least in part on determining that the second set of bits includes one or more errors, a fourth row index based at least in part on the fourth row index being subsequent to the second row index remapped to the portion of the first row, wherein the fourth row index, before remapping the third row, corresponds to a fourth row of the memory array.

2. The method of claim 1, further comprising:
remapping the portion of the third row from the third row index; and
remapping a fifth row from a fifth row index to the third row index based at least in part on a third set of bits retrieved from the fifth row including one or more errors.

3. The method of claim 2, wherein a first subarray index, before and after remapping the third row, corresponds to the portion of the third row, and wherein a second subarray index, before and after remapping the fifth row, corresponds to the portion of the fifth row.

4. The method of claim 1, further comprising:
remapping a portion of the second row from the second row index to the first row index based at least in part on remapping the portion of the first row to the second row index.

5. The method of claim 4, further comprising:
remapping a portion of the fourth row from the fourth row index to the third row index based at least in part on remapping the portion of the third row to the fourth row index.

6. The method of claim 1, further comprising:
transmitting an indication that the portion of the first row has been remapped to the second row index; and
transmitting an indication that the portion of the fourth row has been remapped to the fourth row index.

7. The method of claim 6, wherein the indication that the portion of the first row has been remapped to the second row index is transmitted in response to an access command for the first row index, the method further comprising:
receiving an access command for the second row index based at least in part on transmitting the indication that the portion of the first row has been remapped to the second row index.

8. The method of claim 1, further comprising:
identifying, as part of a test operation on the memory array, a set of row indices each of which is associated with a respective row identified as storing data that has one or more respective errors, wherein determining that the first set of bits includes the one or more errors is based at least in part on the first row index being included in the set of row indices.

9. The method of claim 1, wherein remapping the portion of the first row to the second row index comprises remapping the entire first row to the second row index, and wherein remapping the portion of the third row to the fourth row index comprises remapping the entire third row to the fourth row index.

10. A memory system, comprising:
one or more memory devices; and
one or more controllers coupled with the one or more memory devices and configured to cause the memory system to:

determine that a first set of bits retrieved from a first row of a memory array of the one or more memory devices includes one or more errors;
remap a portion of the first row from a first row index to a second row index based at least in part on determining that the first set of bits includes the one or more errors, wherein the second row index, before remapping the first row, corresponds to a second row of the memory array;
determine that a second set of bits retrieved from a third row of the memory array includes one or more errors, wherein the third row corresponds to a third row index; and
select, for remapping a portion of the third row from the third row index based at least in part on determining that the second set of bits includes one or more errors, a fourth row index based at least in part on the fourth row index being subsequent to the second row index remapped to the portion of the first row, wherein the fourth row index, before remapping the third row, corresponds to a fourth row of the memory array.

11. The memory system of claim 10, wherein the one or more controllers is further configured to cause the memory system to:
remapping the portion of the third row from the third row index; and
remapping a fifth row from a fifth row index to the third row index based at least in part on a third set of bits retrieved from the fifth row including one or more errors.

12. The memory system of claim 11, wherein a first subarray index, before and after remapping the third row, corresponds to the portion of the third row, and wherein a second subarray index, before and after remapping the fifth row, corresponds to the portion of the fifth row.

13. The memory system of claim 10, wherein the one or more controllers is further configured to cause the memory system to:
remap a portion of the second row from the second row index to the first row index based at least in part on remapping the portion of the first row to the second row index.

14. The memory system of claim 13, wherein the one or more controllers is further configured to cause the memory system to:
remap a portion of the fourth row from the fourth row index to the third row index based at least in part on remapping the portion of the third row to the fourth row index.

15. The memory system of claim 10, wherein the one or more controllers is further configured to cause the memory system to:
transmit an indication that the portion of the first row has been remapped to the second row index; and
transmit an indication that the portion of the fourth row has been remapped to the fourth row index.

16. The memory system of claim 15, wherein the indication that the portion of the first row has been remapped to the second row index is transmitted in response to an access command for the first row index, and wherein the one or more controllers is further configured to cause the memory system to:
receive an access command for the second row index based at least in part on transmitting the indication that the portion of the first row has been remapped to the second row index.

17. The memory system of claim 10, wherein the one or more controllers is further configured to cause the memory system to:

identify, as part of a test operation on the memory array, a set of row indices each of which is associated with a respective row identified as storing data that has one or more respective errors, wherein determining that the first set of bits includes the one or more errors is based at least in part on the first row index being included in the set of row indices.

18. The memory system of claim 10, wherein remapping the portion of the first row to the second row index comprises remapping the entire first row to the second row index, and wherein remapping the portion of the third row to the fourth row index comprises remapping the entire third row to the fourth row index.

19. A non-transitory computer-readable medium storing code comprising instructions which, when executed by processing circuitry of a memory system, cause the memory system to:

determine that a first set of bits retrieved from a first row of a memory array includes one or more errors;

remap a portion of the first row from a first row index to a second row index based at least in part on determining that the first set of bits includes the one or more errors, wherein the second row index, before remapping the first row, corresponds to a second row of the memory array;

determine that a second set of bits retrieved from a third row of the memory array includes one or more errors, wherein the third row corresponds to a third row index; and select, for remapping a portion of the third row from the third row index based at least in part on determining that the second set of bits includes one or more errors, a fourth row index based at least in part on the fourth row index being subsequent to the second row index remapped to the portion of the first row, wherein the fourth row index, before remapping the third row, corresponds to a fourth row of the memory array.

20. The non-transitory computer-readable medium of claim 19, wherein then instructions, when executed by the processing circuitry of the memory system, further cause the memory system to:

remap the portion of the third row from the third row index; and remap a fifth row from a fifth row index to the third row index based at least in part on a third set of bits retrieved from the fifth row including one or more errors.

* * * * *